(12) United States Patent
Rakshit et al.

(10) Patent No.: US 9,966,137 B2
(45) Date of Patent: May 8, 2018

(54) LOW POWER ANALOG OR MULTI-LEVEL MEMORY FOR NEUROMORPHIC COMPUTING

(71) Applicant: Samsung Electronics Co., Ltd., Suwon-si, Gyeonggi-do (KR)

(72) Inventors: Titash Rakshit, Austin, TX (US); Borna J. Obradovic, Leander, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days. days.

(21) Appl. No.: 15/343,182

(22) Filed: Nov. 3, 2016

(65) Prior Publication Data

US 2018/0053550 A1 Feb. 22, 2018

Related U.S. Application Data

(60) Provisional application No. 62/376,336, filed on Aug. 17, 2016.

(51) Int. Cl.
*G11C 13/00* (2006.01)
*G11C 11/56* (2006.01)

(52) U.S. Cl.
CPC .......... *G11C 13/0069* (2013.01); *G11C 11/56* (2013.01); *G11C 13/004* (2013.01)

(58) Field of Classification Search
CPC .... G11C 13/0069; G11C 11/56; G11C 13/004
See application file for complete search history.

(56) References Cited

U.S. PATENT DOCUMENTS

| | | | |
|---|---|---|---|
| 4,874,963 A | 10/1989 | Alspector | |
| 5,146,602 A | 9/1992 | Holler et al. | |
| 5,329,610 A | 7/1994 | Castro | |
| 5,583,360 A | 12/1996 | Roth et al. | |
| 5,592,418 A | 1/1997 | Sabatini et al. | |
| 6,269,352 B1 | 7/2001 | Fabbrizio et al. | |
| 7,049,872 B2 | 5/2006 | Diorio et al. | |
| 7,389,101 B2 | 6/2008 | Diorio et al. | |
| 7,548,460 B2 | 6/2009 | Diorio et al. | |
| 8,001,065 B2* | 8/2011 | Tanaka | G06N 3/063 706/15 |
| 9,760,533 B2* | 9/2017 | Fick | G06F 17/11 |
| 2014/0312400 A1 | 10/2014 | Schmidt et al. | |
| 2017/0194337 A1* | 7/2017 | Lee | H01L 27/11521 |

* cited by examiner

*Primary Examiner* — Tri Hoang
(74) *Attorney, Agent, or Firm* — Lewis Roca Rothgerber Christie LLP

(57) ABSTRACT

A neuron circuit for use in a neural network is disclosed. The neural network includes a plurality of field effect transistors having confined channels. The sources and drains of the field effect transistors are connected in series. A plurality of input terminals for receiving a plurality of input voltages may be connected to a drain terminal of a corresponding field effect transistor. The threshold voltages of the field effect transistors can be programmed by increasing or decreasing a number of excess minority carriers in the confined channels, thereby programming the resistance presented by the field effect transistor.

5 Claims, 4 Drawing Sheets

LOW POWER ANALOG OR MULTI-LEVEL MEMORY FOR NEUROMORPHIC COMPUTING

CROSS-REFERENCE TO RELATED APPLICATION(S)

This application claims priority to and the benefit of U.S. Provisional Application 62/376,336, filed on Aug. 17, 2016, entitled "LOW POWER ANALOG OR MULTI-LEVEL MEMORY FOR NEUROMORPHIC COMPUTING", the entire content of which is incorporated herein by reference.

BACKGROUND

Neural networks, sometimes called artificial neural networks, are a computational paradigm inspired by the operation of a biological brain. Inputs are passed through a network of nodes along weighted paths to a set of outputs. The nodes and weighted paths give an output based on the input. They can be used in areas such as pattern recognition, classification, language processing, and artificial intelligence. Neural networks may be implemented as software and/or hardware.

The above information disclosed in this Background section is only for enhancement of understanding of the background of the disclosure, and therefore it may contain information that does not form the prior art that is already known to a person of ordinary skill in the art.

SUMMARY

Aspects of example embodiments are directed toward a memory cell for use in a neural network including a field effect transistor with a confined channel, the field effect transistor being configured to store a value corresponding to a synaptic weight in a neural network, the stored value corresponding to a number of excess minority carriers in the confined channel.

The field effect transistor may be a silicon on insulator field effect transistor.

The field effect transistor may be a fully depleted silicon on insulator field effect transistor.

The field effect transistor may be a gate all around field effect transistor.

The confined channel of the field effect transistor may be confined by a semiconductor material having a higher bandgap than the confined channel's bandgap.

A word line may be coupled to the gate of the field effect transistor to apply a selecting voltage to the gate, a bit line may be coupled to the drain of the field effect transistor to apply a programming voltage to the drain, and the source of the field effect transistor may be coupled to a ground voltage, and wherein a level of the programming voltage may determine the value stored by the memory cell.

The level of the programming voltage may be between a minimum voltage sufficient to induce impact ionization and a maximum voltage allowable without causing junction breakdown in the field effect transistor.

The level of the programming voltage may be between the bandgap of the confined channel and two times the bandgap of the confined channel.

The level of the programming voltage may be one of a plurality of digital levels corresponding to digital levels for the value stored by the memory cell.

The plurality of digital levels may include three or more levels.

The memory cell may be configured to be read when the selecting voltage is applied to the word line and an input voltage is applied to the bit line, the input voltage having a level less than the bandgap of the confined channel, and the level of a weighted voltage may be based on the level of the input voltage and the value stored by the memory cell. Read is performed at a stack level that include multiple transistors each of which is described in paragraphs 004 to 008.

Other aspects of example embodiments are directed toward a neuron circuit including a plurality of field effect transistors, a plurality of input terminals, a word line, and an output resistor. The plurality of field effect transistors have confined channels, and the sources and drains of the field effect transistors are connected in series. The plurality of input terminals receive a plurality of input voltages and are each connected to a drain terminal of a corresponding one of the field effect transistors. The word line is coupled to the gates of the field effect transistors. The output resistor is coupled between ground and the sources and drains of the field effect transistors. The voltage across the output resistor is a weighted voltage utilized for generation of a neuron output voltage.

The neuron circuit may include a linear amplifier coupled to the output resistor and configured to generate the neuron output voltage based on the weighted voltage.

The word line may be coupled to all of the gates of the plurality of field effect transistors to apply a selecting voltage to all of the gates, thereby activating all of the plurality of field effect transistors for reading or writing.

Other aspects of example embodiments are directed toward a neural network including an input layer comprising a plurality of inputs, and a hidden layer comprising a plurality of the neuron circuit described above, wherein each neuron circuit receives each of the plurality of inputs.

The number of the plurality of field effect transistors in each of the neuron circuits may be equal to the number of inputs in the input layer.

Other aspects of example embodiments are directed toward a method of programming and reading a value stored by a memory cell for use in a neural network. The memory cell includes a field effect transistor with a confined channel, the value stored being defined by the number of excess minority carriers in the confined channel. The memory cell also includes a word line coupled to the gate of the field effect transistor and a bit line coupled to the drain of the field effect transistor. To program or write each cell individually, the method includes applying a selecting voltage to the word line to program the value stored by the memory cell, applying a programming voltage as a difference between bitlines of adjacent devices, the programming voltage having a level between the bandgap of the confined channel and two times the bandgap of the confined channel, wherein the value stored by the memory cell is determined by the level of the programming voltage, applying a ground voltage to the source of the field effect transistor, applying the selecting voltage to the word line to read the value stored by the memory cell, applying an input voltage to the bit line of the top cell, the input voltage having a level less than the bandgap of the confined channel, the read performed on the full stack (multiple transistors or cells together) whereas write/programming is done cell by cell (transistor by transistor).

The level of the programming voltage may be one of a plurality of digital levels corresponding to digital levels for the value stored by the memory cell.

The weighted voltage may be thresholded into one of a plurality of digital levels to generate an output voltage.

These and other features and aspects of the present disclosure will be more fully understood when considered with respect to the following detailed description, appended claims, and accompanying drawings. Of course, the actual scope of the invention is defined by the appended claims and their equivalents.

BRIEF DESCRIPTION OF THE DRAWINGS

The accompanying drawings, together with the specification, illustrate example embodiments of the present disclosure, and, together with the description, serve to explain the principles of the present disclosure.

DETAILED DESCRIPTION

Figure 1:
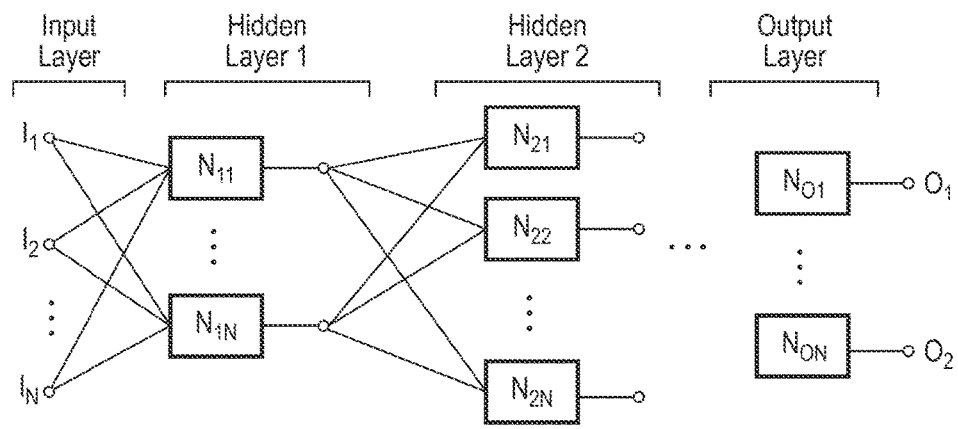
FIG. 1 is a block diagram of a neural network according to embodiments of the present disclosure.

In the following detailed description, only certain example embodiments of the present disclosure are shown and described, by way of illustration. As those skilled in the art would recognize, the embodiments according to the invention may have many different forms and should not be construed as being limited to the embodiments set forth herein. Descriptions of features or aspects within each example embodiment should typically be considered as available for other similar features or aspects in other example embodiments. Like reference numerals designate like elements throughout the specification.

FIG. 1 is a block diagram of a neural network according to embodiments of the present disclosure. The neural network of FIG. 1 is a hardware-implemented neural network. It may include an input layer, one or more hidden layers, and an output layer. The hidden layers, such as a hidden layer 1 and a hidden layer 2, and the output layer may each include a number of neuron circuits. For example, in FIG. 1, the hidden layer 1 includes neuron circuits $N_{11}$-$N_{1N}$, the hidden layer 2 includes neuron circuits $N_{21}$-$N_{2N}$, and the output layer includes neuron circuits $N_{O1}$-$N_{ON}$.

The input layer may receive a series of input values $I_1$-$I_N$. The input layer may pass these input values $I_1$-$I_N$ to the first hidden layer. Each hidden layer may receive inputs from the previous layer and, based on those inputs, may generate outputs which are passed to the next layer. The output layer receives the outputs of the last hidden layer and generates output values $O_1$-$O_N$.

Each layer may have a different number of neuron circuits. Each neuron circuit may receive each of the outputs of the previous layer as a separate input, and may generate one output. Accordingly, the number of outputs a layer has may be the number of neuron circuits in that layer, and the number of inputs a layer has may be the number of neuron circuits in the previous layer.

The neuron circuits may have an independent weight which they apply to each of their received inputs called a synaptic weight. The neuron circuits may combine the weighted inputs and apply them to a transfer function to generate their respective outputs.

Figure 2A:
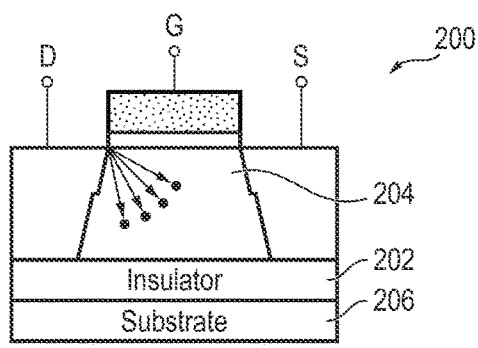
FIG. 2A is a diagram of a memory cell according to embodiments of the present disclosure.

FIG. 2A is a diagram of an embodiment of a memory cell 200 according to embodiments of the present disclosure. The memory cell 200 may be a programmable resistive device implementing an analog or multilevel memory. The analog or multilevel value stored in the memory cell may be used as a synaptic weight in a neural network. A memory cell 200 may be (or may include) a field effect transistor (hereinafter 'FET') with a confined channel. For example, as shown in FIG. 2A, a memory cell may be a silicon on insulator FET, such as a fully depleted silicon on insulator FET. The insulator layer 202 isolates the channel 204 from the bulk substrate 206. In some embodiments, the FET is a metal-oxide semiconductor field effect transistor (MOSFET).

The memory cell 200 may be programmed to store a value by altering the FET threshold voltage $V_T$. To this end, the memory cell 200 may make use of impact ionization and the parasitic bipolar effect. A selecting voltage may be applied to the gate of the FET, a programming voltage difference may be applied to the source and drain of the FET. This may generate excess minority carriers in the channel 204, and because the channel 204 is confined by the insulator 202, the excess minority carriers will not disperse into the bulk substrate 206. Accordingly, the excess minority carriers may alter the threshold voltage $V_T$ of the FET, even after the programming voltage is removed from the FET. The amount of excess minority carriers generated in the confined channel 204 may depend on the level of the programming voltage. Accordingly, programming the memory cell 200 may include increasing the level of the programming voltage and a previously programmed state of the memory cell 200.

In other embodiments, the programming voltage is a variable pulse width signal and the level of minority carriers generated in the confined channel 204 depends on the pulse width of the programming voltage. Accordingly, programming the memory cell 200 may include increasing or decreasing excess minority carriers contained in the confined channel 204, depending on the pulse width of the programming voltage and a previously programmed state of the memory cell 200.

In order to program the memory cell 200 by increasing or decreasing excess minority carriers in the confined channel 204, the selecting voltage may be sufficiently high to open the channel 204. In some embodiments, the selecting voltage may be greater than the bandgap of the confined channel 204. In some embodiments, the selecting voltage may be less than or equal to about 2.5 volts, in order to allow the memory cell 200 to be implemented using CMOS technology.

Further, in order to program the memory cell 200 by increasing or decreasing excess minority carriers in the confined channel 204, the programming voltage may need to have a level which is sufficiently high to generate excess minority carriers in the confined channel 204 (i.e. high enough to induce impact ionization), but low enough that it does not cause junction breakdown in the FET. In some embodiments, the programming voltage may have a range between the bandgap of the confined channel 204 (on the low end of the range) and two times the bandgap of the confined channel 204 (on the high end). In some embodiments, the maximum level of the programming voltage may be less than or equal to about 2.5 volts, in order to allow the memory cell 200 to be implemented using CMOS technology.

The bandgap of the confined channel 204 may depend on the material used to fabricate the confined channel 204. In some embodiments, the semiconductor used may be silicon, and the bandgap may be about 1.1 volts. In embodiments, the semiconductor used may be germanium, and the bandgap may be about 0.67 volts. In embodiments using a low bandgap semiconductor to fabricate the confined channel 204, the memory cell 200 may be very low voltage (for example, the selecting and programming voltages may be less than or equal to 1.4 volts in a memory cell using germanium to fabricate the confined channel 204). Lower bandgap materials may result in a lower stability of the modified threshold voltage $V_T$ of the FET.

As mentioned above, the memory cell 200 may be an analog or a multilevel memory. In embodiments where the memory cell 200 is an analog memory, the memory cell 200 may store an analog value. Accordingly, the programming voltage may have a range of analog levels falling within its allowed minimum and maximum values.

In embodiments where the memory cell 200 is a multilevel memory, the memory cell 200 may store one of a predefined set of digital values. Accordingly, the programming voltage may have one of a predefined set of digital levels falling within the minimum and maximum allowed values for the programming voltage. The predefined set of digital levels may corresponding to the predefined digital values which may be stored by the memory cell 200. In some embodiments, the predefined set of digital levels may include four or more levels.

Figure 2B:
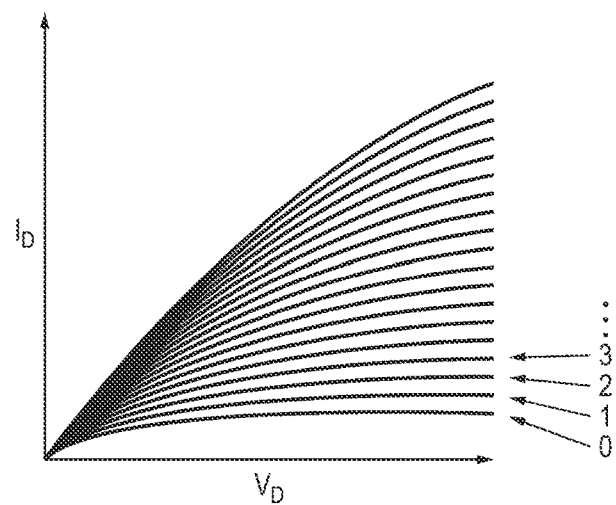
FIG. 2B is a graph demonstrating the relationship between drain current and voltage for different values of threshold voltage of the memory cell of FIG. 2A.

FIG. 2B is a graph demonstrating the relationship between drain current $I_D$ and voltage $V_D$ for different values of threshold voltage $V_T$ of the memory cell 200 FET. Each line on the graph corresponds to a different threshold voltage $V_T$ value. Where the value of the threshold voltage $V_T$ corresponds to a value stored by the memory cell 200, the memory cell 200 may be read or otherwise used by utilizing the I/V relationship of the memory cell 200 FET. For example, as shown in FIG. 2B, a first line showing the I/V relationship of the memory cell 200 FET associated with a first threshold voltage $V_T$ level may be representative of a first digital level 0; a second I/V line associated with a second threshold voltage $V_T$ level may be representative of a second digital level 1; a third I/V line associated with a third threshold voltage $V_T$ level may be representative of a third digital level 2; and a fourth I/V line associated with a fourth threshold voltage $V_T$ level may be representative of a fourth digital level 3, and so on.

As an example of utilizing the I/V relationship to read the memory cell 200, a voltage may be applied to the FET, and the resultant current output from the FET may be measured to determine the I/V characteristic presented by the FET, and therefore the $V_T$ of the FET and the value stored by the memory cell 200 (i.e., the FET may be used as a programmable resistive device). In some embodiments, the memory cell 200 may be used in this manner to apply a synaptic weight to an input of a neuron circuit. In other words, instead of being 'read' directly, the value stored by the memory cell 200 may be utilized to modify an input voltage level to obtain an output voltage level. Accordingly, the value stored by the memory cell 200 may be effectively used in a calculation, and therefore 'read,' without requiring a separate step of reading the value from the memory cell 200.

In order to read the value stored by a memory cell 200, the input voltage applied to the stack of FETs may be low enough to avoid influencing the number of excess minority carriers in the confined channel 204. In some embodiments, input voltages applied to read the value of the memory cell 200 may not exceed the bandgap of the confined channel. The selecting voltage applied to the gate of the FET may be sufficiently high to open the confined channel 204, for example greater than the bandgap of the confined channel 204.

In some embodiments, to maintain the number of excess minority carriers in the confined channel 204, the memory cell 200 is placed in a hold state when the memory cell 200 is not being programmed or read. In some embodiments, this is accomplished by setting the selecting voltage to a low level and the programming voltage to a high level.

Although the FET with the confined channel 204 is discussed above with reference to a silicon on isolator FET, other embodiments are contemplated. In some embodiments, the FET may be a gate all around FET. In other embodiments, the channel of the FET may be confined by another semiconductor with a higher bandgap than the channel bandgap. A confined channel may be an electrostatically-defined well which prevents or substantially prevents excess minority carriers from leaving the well.

Figure 3:
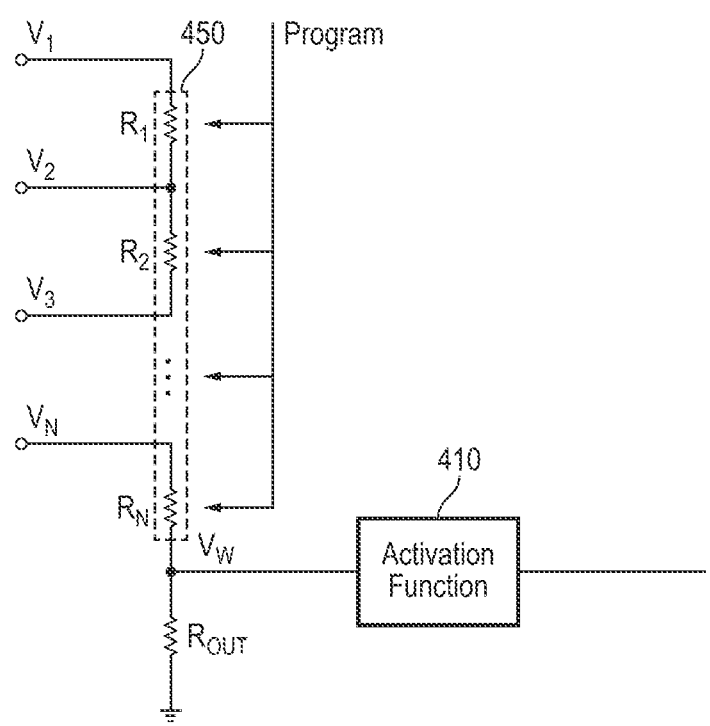
FIG. 3 is a block diagram of a neuron circuit according to embodiments of the present disclosure.

FIG. 3 is a block diagram of a neuron circuit according to embodiments of the present disclosure. The neuron circuit may receive input voltages at input terminals $V_1$-$V_N$. The neuron circuit may include programmable resistive elements $R_1$-$R_N$. The programmable resistive elements $R_1$-$R_N$ may present a variable resistance which may be changed through programming. In some embodiments, a programmable resistive element $R_1$-$R_N$ may be programmed by applying a selecting voltage to the program/read select line and applying a programming voltage across the programmable resistive element $R_1$-$R_N$. Each of the program lines may be coupled together such that each programmable resistive element $R_1$-$R_N$ receives the same programming voltage.

The programmable resistive elements $R_1$-$R_N$ may weight the input voltages, using their resistances as a synaptic weight, thereby generating a weighted voltage $V_W$ across an output resistor $R_{OUT}$. For example, the resistive elements $R_1$-$R_N$ may be used to apply a weight to the input voltages. In some example embodiments, the resistances of the variable resistive elements $R_1$-$R_N$ are used as coefficients to scale the input voltages to generate the weighted voltage $V_W$. An activation function module 410 may apply an activation function to the weighted voltage $V_W$ to generate an output voltage. In some embodiments, the activation function is a non-linear function. In some embodiments, the activation function may be (or may include) a sigmoid function.

Figure 4:
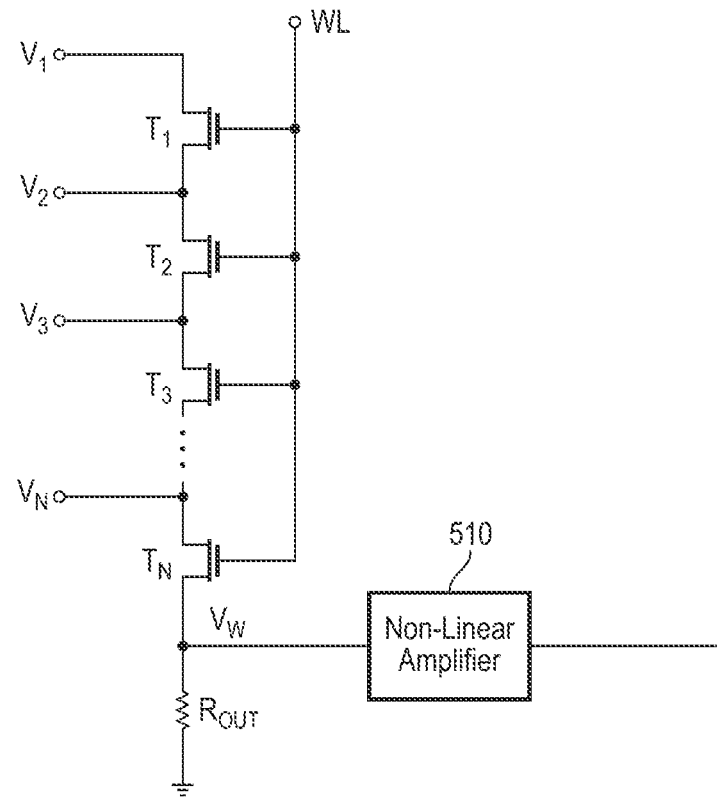
FIG. 4 is a circuit diagram of a neuron circuit according to embodiments of the present disclosure.

FIG. 4 is a circuit diagram of an example neuron circuit of FIG. 3 according to embodiments of the present disclosure. In FIG. 4, the programmable resistive elements $R_1$-$R_N$ may be implemented as the memory cells $T_1$-$T_N$. The memory cells $T_1$-$T_N$ may each include a FET with a confined channel. In some embodiments, the memory cells $T_1$-$T_N$ may be the memory cell 200 of FIG. 2A. The sources and drains of the FETs may be connected in series.

A write line WL may connect the gate of each of the FETs of the memory cells $T_1$-$T_N$. Accordingly, in some embodiments, every memory cell $T_1$-$T_N$ in a neuron circuit may be activated for reading or writing at the same time by a selecting voltage having the same level for each memory cell $T_1$-$T_N$. Each input terminal $V_1$-$V_N$ may be coupled to a drain terminal of one of the FETs of the memory cells $T_1$-$T_N$. As described above relative to FIGS. 2A and 2B, voltages may be applied to the write line WL and the input terminals $V_1$-$V_N$ at the source and drain of a memory cell $T_1$-$T_N$ to add or remove excess minority carriers from the confined channels of the memory cells $T_1$-$T_N$, changing their respective threshold voltages $V_T$ and, accordingly, the apparent resistance presented between their sources and drains (i.e. programming the memory cells $T_1$-$T_N$).

In some embodiments, the memory cells $T_1$-$T_N$ of FIG. 4 may be programmed one-at-a-time. For example, the memory cell $T_1$ may be programmed by applying voltages to the write line WL and the input terminals $V_1$-$V_N$. A selecting voltage may be applied to the write line WL. A programming voltage may be applied to the first input terminal $V_1$. The remaining input terminals $V_2$-$V_N$ may be grounded. Accordingly, although all the memory cells $T_1$-$T_N$ are receiving the selecting voltage at their gate, the memory cell $T_1$ may have the programming voltage across its source and drain and may be programmed, while the remaining memory cells $T_2$-$T_N$ may have zero volts across their sources and drains and may not be programmed.

In some embodiments, for example, the memory cell $T_1$ may be programmed by applying voltages to the write line WL and the input terminals $V_1$-$V_2$. The selecting voltage may be applied to the write line WL. A programming voltage may be applied to the first input terminal $V_1$ and the second input terminal $V_2$. The remaining input terminals $V_3$-$V_N$ may be grounded. Accordingly, although all the memory cells $T_1$-$T_N$ are receiving the selecting voltage at their gate, the memory cell T1 may have the programming voltage across its source and drain and may be programmed, while the remaining memory cells $T_2$-$T_N$ may have zero volts across their sources and drains and may not be programmed.

The memory cells $T_1$-$T_N$ may be programmed to act as synaptic weights for input voltages. To that end, each input voltage may be applied to an input terminal $V_1$-$V_N$, and (when the selecting voltage is applied to the write line WL) the currently programmed resistance for each FET may weight the corresponding input voltage. The sum of the weighted input voltages may be a weighted voltage $V_W$ across the output resistor $R_{OUT}$. The weighted voltage $V_W$ may be applied to a non-linear amplifier 510 to generate a neuron output voltage.

In some embodiments, a neuron circuit in a neural network may receive the neuron output voltage of another neuron circuit as an input. Accordingly, in embodiments where memory cells $T_1$-$T_N$ are multilevel memory cells, the neuron output voltage may be thresholded into one of a predefined set of digital levels. Thresholded may mean that the neuron output voltage is set to one of a predefined set of digital levels based on the value of the neuron output voltage falling within a set range (e.g. if the neuron output voltage is between 0 and 1.1V, it is set to 1.1V, if it is between 1.1V and 1.5V, it is set to 1.5V, if it is between 1.5V and 1.9V, it is set to 1.9V; etc.).

Figure 5:
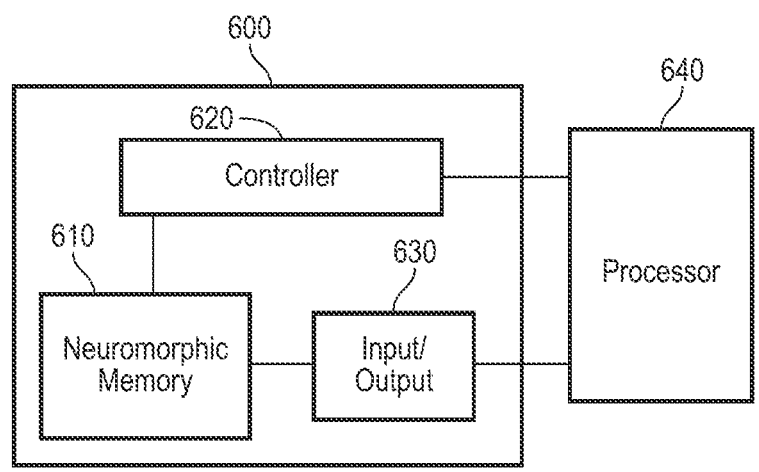
FIG. 5 is a block diagram of a neuromorphic core according to embodiments of the present disclosure.

FIG. 5 is a block diagram of a neuromorphic core 600 according to embodiments of the present disclosure. The neuromorphic core 600 may include a neuromorphic memory 610, a controller 620, and an input/output circuit 630.

The neuromorphic memory 610 may be a hardware-based neural network implemented using analog or multilevel resistive memory cells according to embodiments of the present disclosure. In some embodiments, the neuromorphic memory is implemented using neuron circuits such as the neuron circuit of FIG. 4, for example as set forth in FIG. 6, below.

The controller 620 may be coupled to write lines and bit lines of the neuromorphic memory 610. The controller 620 may be configured to apply voltages (e.g., selecting voltages, programming voltages) to the write lines and bit lines in order to program synaptic weights of the neuromorphic memory 610. For example, the controller 620 may add or remove excess minority carriers from the confined channels of the analog or multilevel resistive memory cells of the neuromorphic memory 610.

A processor 640 may be coupled to the controller 620. The processor 640 may instruct the controller 620 when and how to program the neuromorphic memory 610. The processor 640 may also instruct the controller 620 when to set the neuromorphic memory 610 to read mode, for example by applying the selecting voltage to the word lines.

An input/output circuit 630 may be coupled to the neuromorphic memory 610. The input/output circuit 630 may apply input values to an input layer and receive output values from an output layer. In some embodiments, the input/output circuit 630 may receive input values and apply them directly to the input layer, or receive output values from the output layer and output them directly. In other embodiments, the input/output circuit 630 may receive an input and may translate that input into a series of inputs configured to be applied to the input layer of the neuromorphic memory 610. In other embodiments, the input/output circuit 630 may interpret the output values from the output layer and may output a message or value based on the interpretation of the output values.

The input/output circuit 630 may receive inputs from the processor 640 and may send outputs to the processor 640. In other embodiments, the processor 640 is coupled directly to the neuromorphic memory 610. The processor 640 may apply values to the input layer and receive outputs from the output layer directly, and the input/output circuit 630 may be omitted.

In some embodiments, the neuromorphic core 600 (including the neuromorphic memory 610) and the processor 640 are embedded on the same chip. For example, the neuromorphic core 600 and the processor 640 may both be embedded in a silicon CMOS logic chip, for example, as portions of a system on a chip. Conventional analog or multilevel resistive memory cells may require voltages which are too high to be compatible with embedded silicon CMOS logic design, for example greater than 5V. The levels of the programming voltage and the selecting voltage used in embodiments of a neuromorphic memory 610 according to the present disclosure may be low enough to implement the neuromorphic memory 610 with analog or multilevel resistive memory cells using CMOS logic, thereby enabling the neuromorphic core 600 to be embedded. In some embodiments, the programming voltage and the selecting voltage are less than 2.5V.

Figure 6:
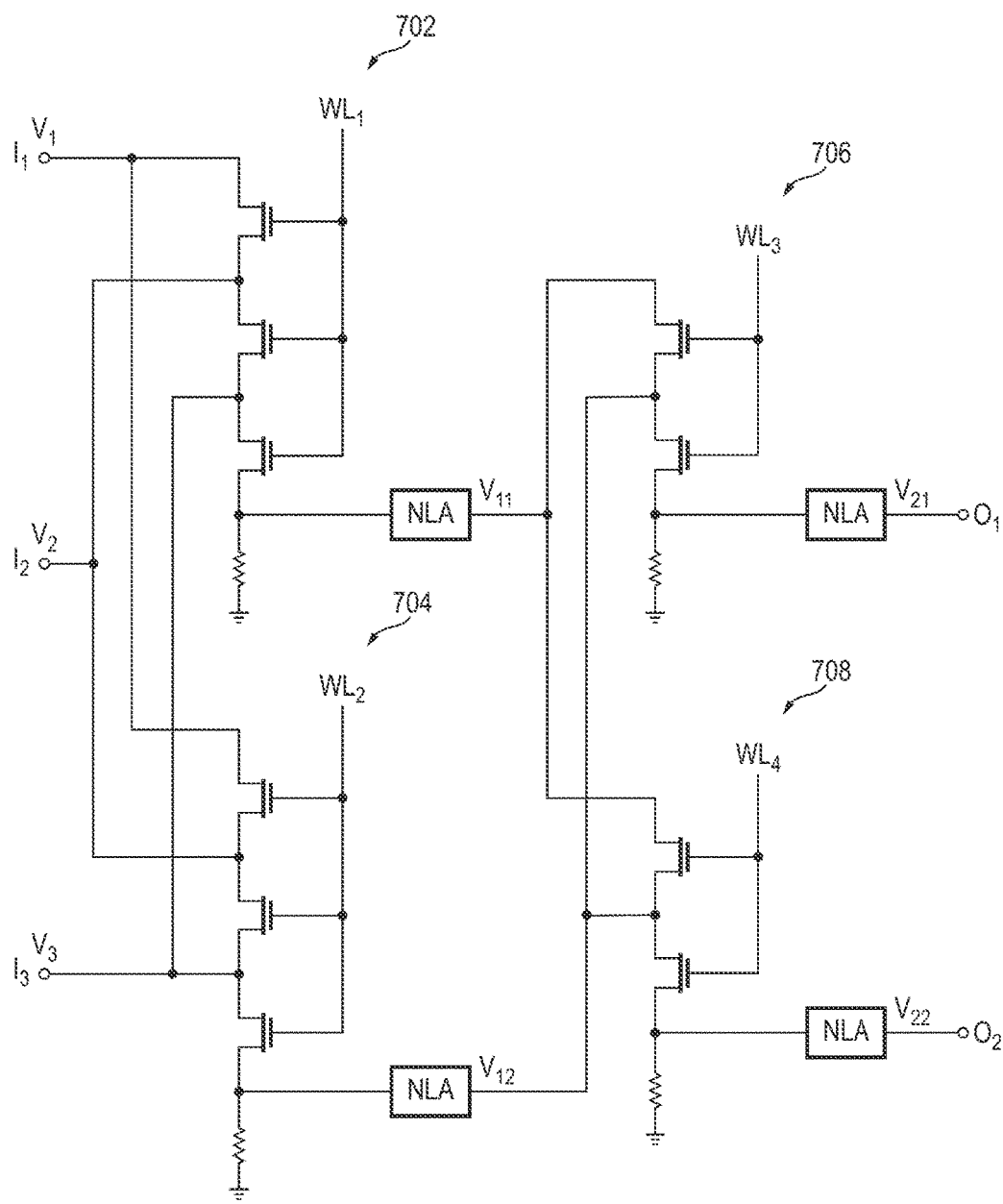
FIG. 6 is a circuit diagram of a neuromorphic memory according to embodiments of the present disclosure.

FIG. 6 is a circuit diagram of a neuromorphic memory according to embodiments of the present disclosure. The neuromorphic memory of FIG. 6 may include a first neuron circuit 702, a second neuron circuit 704, a third neuron circuit 706, and a fourth neuron circuit 708. Each of the neuron circuits 702, 704, 706, and 708 may include the neuron circuit of FIG. 4, or may be or include any other suitable variation of the circuit of FIG. 4 as those skilled in the art can appreciate based on the teachings of the present disclosure. The neuromorphic memory may also include inputs $I_1$, $I_2$, and $I_3$ in the input layer, and outputs $O_1$ and $O_2$ in the output layer.

The hidden layer may include the first neuron circuit 702 and the second neuron circuit 704. The output layer may include the third neuron circuit 706 and the fourth neuron circuit 708. The neuron circuits 702, 704, 706, and 708 may each include a memory cell for each input that will be received from the previous layer. For example, both the first neuron circuit 702 and the second neuron circuit 704 may include three memory elements corresponding to the input layer inputs $I_1$, $I_2$, and $I_3$. Both third neuron circuit 706 and the fourth neuron circuit 708 may include two memory elements corresponding to the output of the first neuron circuit 702 and the output of the second neuron circuit 704.

The neuromorphic memory may receive a first voltage $V_1$ at the first input $I_1$, a second voltage $V_2$ at the second input $I_2$, and a third voltage $V_3$ at the third input $I_3$. The first neuron circuit 702 may receive the first, second, and third voltages $V_1$, $V_2$, and $V_3$, weight them using the memory cells to acquire a weighted voltage, and apply the weighted voltage to a non-linear amplifier NLA to generate a first neuron output voltage $V_{11}$. The second neuron circuit 704 may receive the first, second, and third voltages $V_1$, $V_2$, and $V_3$, weight them using the memory cells to acquire a weighted voltage, and apply the weighted voltage to a non-linear amplifier NLA to generate a second neuron output voltage $V_{12}$.

The third neuron circuit 706 may receive the first neuron output voltage $V_{11}$ and the second neuron output voltage $V_{12}$, weight them using the memory cells to acquire a weighted voltage, and apply the weighted voltage to a non-linear amplifier NLA to generate a first output voltage $V_{21}$ at output $O_1$.

The fourth neuron circuit 708 may receive the first neuron output voltage $V_{11}$ and the second neuron output voltage $V_{12}$, weight them using the memory cells to acquire a weighted voltage, and apply the weighted voltage to a non-linear amplifier NLA to generate a second output voltage $V_{22}$ at output $O_2$.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

What is claimed is:

1. A neuron circuit comprising:
 a plurality of field effect transistors having confined channels, with sources and drains of the field effect transistors being connected in series;
 a plurality of input terminals for receiving a plurality of input voltages, each of the input terminals being connected to a drain terminal of a corresponding one of the field effect transistors;
 a word line coupled to gates of the field effect transistors; and an output resistor coupled between ground and the sources and drains of the field effect transistors, a voltage across the output resistor being a weighted voltage utilized for generation of a neuron output voltage.

2. The neuron circuit of claim 1, further comprising: a non-linear amplifier coupled to the output resistor and configured to generate the neuron output voltage based on the weighted voltage.

3. The neuron circuit of claim 1, wherein the word line is coupled to all of the gates of the plurality of field effect transistors to apply a selecting voltage to all of the gates, thereby activating all of the plurality of field effect transistors for reading or writing.

4. A neural network comprising:
an input layer comprising a plurality of inputs; and
a hidden layer comprising a plurality of the neuron circuit of claim 1 wherein each neuron circuit is to receive each of the plurality of inputs.

5. The neural network of claim 4, wherein a number of the plurality of field effect transistors in each neuron circuit is equal to a number of inputs in the input layer.

* * * * *